(12) United States Patent
Liao et al.

(10) Patent No.: US 11,890,832 B2
(45) Date of Patent: Feb. 6, 2024

(54) PREPREG AND METALLIC CLAD LAMINATE

(71) Applicant: NAN YA PLASTICS CORPORATION, Taipei (TW)

(72) Inventors: Te-Chao Liao, Taipei (TW);
Hao-Sheng Chen, Taipei (TW);
Hung-Yi Chang, Taipei (TW);
Chih-Kai Chang, Taipei (TW);
Chia-Lin Liu, Taipei (TW)

(73) Assignee: NAN YA PLASTICS CORPORATION, Taipei (TW)

( * ) Notice: Subject to any disclaimer, the term of this patent is extended or adjusted under 35 U.S.C. 154(b) by 0 days.

(21) Appl. No.: 17/316,677

(22) Filed: May 10, 2021

(65) Prior Publication Data
US 2022/0024182 A1 Jan. 27, 2022

(30) Foreign Application Priority Data
Jul. 23, 2020 (TW) .................................. 109124972

(51) Int. Cl.
*B32B 15/16* (2006.01)
*B32B 15/08* (2006.01)
(Continued)

(52) U.S. Cl.
CPC .............. *B32B 15/16* (2013.01); *B32B 5/16* (2013.01); *B32B 15/08* (2013.01); *B32B 15/14* (2013.01);
(Continued)

(58) Field of Classification Search
CPC .......... B32B 15/16; B32B 5/16; B32B 15/08; B32B 15/14; B32B 2264/1023;
(Continued)

(56) References Cited

U.S. PATENT DOCUMENTS 5,391,423 A * 2/1995 Wnuk .................. B32B 27/306
428/424.8
6,420,476 B1 * 7/2002 Yamada ................. H01B 3/442
524/430
(Continued)

FOREIGN PATENT DOCUMENTS

CN 102161823 A 8/2011
CN 110168670 A * 8/2019 .............. C08F 14/26
(Continued)

*Primary Examiner* — Tamra L. Dicus
(74) *Attorney, Agent, or Firm* — Li & Cai Intellectual Property Office (57) ABSTRACT

A prepreg and a metallic clad laminate are provided. The prepreg includes a reinforcing material and a thermosetting resin layer. The thermosetting resin layer is formed by immersing the reinforcing material in a thermosetting resin composition. The thermosetting resin composition includes a polyphenylene ether resin, a liquid polybutadiene resin, a crosslinker, and fillers. Based on a total weight of the thermosetting resin composition being 100 phr, an amount of the fillers ranges from 50 phr to 70 phr. The fillers include a granular dielectric filler and a flaky thermal conductive filler. The metallic clad laminate is formed by disposing at least one metal layer onto the prepreg.

12 Claims, 3 Drawing Sheets

(51) Int. Cl.
*B32B 15/14* (2006.01)
*B32B 5/16* (2006.01)

(52) U.S. Cl.
CPC ....... *B32B 2250/02* (2013.01); *B32B 2250/03* (2013.01); *B32B 2264/1021* (2020.08); *B32B 2264/1023* (2020.08); *B32B 2264/12* (2013.01); *B32B 2264/201* (2020.08); *B32B 2264/202* (2020.08); *B32B 2307/204* (2013.01); *B32B 2307/302* (2013.01)

(58) Field of Classification Search
CPC ........ B32B 2264/202; B32B 2264/201; B32B 2264/1021; B32B 2250/02; B32B 2250/03; B32B 2264/12; B32B 2307/204; B32B 2307/302
See application file for complete search history.

(56) References Cited

U.S. PATENT DOCUMENTS

| | | | |
|---|---|---|---|
| 7,602,051 B2 | 10/2009 | Ito et al. | |
| 10,017,386 B2 | 7/2018 | Kurokawa et al. | |
| 2007/0155946 A1* | 7/2007 | Berti | C08G 63/6956 528/272 |
| 2010/0096181 A1* | 4/2010 | Nakamura | B32B 7/12 174/394 |
| 2010/0129676 A1* | 5/2010 | Fujimoto | C08L 15/00 524/424 |
| 2014/0353004 A1 | 12/2014 | Jung et al. | |
| 2016/0168378 A1 | 6/2016 | Umehara et al. | |
| 2018/0002932 A1* | 1/2018 | Van Giel | B32B 27/304 |
| 2021/0238381 A1* | 8/2021 | Nakazumi | C08K 3/38 |

FOREIGN PATENT DOCUMENTS

| | | | |
|---|---|---|---|
| CN | 111378242 A | 7/2020 | |
| JP | 11255992 A | 9/1999 | |
| JP | 2005232313 A | 9/2005 | |
| JP | 2007224269 A | 9/2007 | |
| JP | 2011236316 A | 11/2011 | |
| JP | 2012229319 A | 11/2012 | |
| JP | 2015193704 A | 11/2015 | |
| JP | 2016113543 A | 6/2016 | |
| JP | 2017132858 A | 8/2017 | |
| JP | 20196837 A | 1/2019 | |
| WO | WO2015122379 A1 | 8/2015 | |
| WO | WO-2019208129 A1 * | 10/2019 | ............ B32B 15/08 |

* cited by examiner

PREPREG AND METALLIC CLAD LAMINATE

CROSS-REFERENCE TO RELATED PATENT APPLICATION

This application claims the benefit of priority to Taiwan Patent Application No. 109124972, filed on Jul. 23, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a prepreg and a metallic clad laminate, and more particularly to a prepreg and a metallic clad laminate which have excellent dielectric properties, conductive properties, and peeling strength.

BACKGROUND OF THE DISCLOSURE

Millimeter waves (mmWave) are electromagnetic waves with a wavelength ranging from 1 mm to 10 mm and a frequency ranging from 30 GHz to 300 GHz. Millimeter waves are also called extremely high frequency (EHF) waves. Millimeter waves are mainly used in electronic communications, military communications, scientific research, and medical treatments. In addition, millimeter waves are also an important technique for developing the fifth generation wireless system (5G wireless system). In order to meet the requirements of the 5G wireless system, high frequency transmission is undoubtedly a mainstream trend of development. Accordingly, much research in the industry has been devoted to high-frequency substrate materials that can be applied in the high frequency (e.g., a frequency ranging between 6 GHz and 77 GHz) transmission. Therefore, a high-frequency substrate can be used in base station antennas, satellite radars, automotive radars, wireless communication antennas, or power amplifiers.

In order to be applied in high frequency transmission, the high frequency substrate should have a high dielectric constant (Dk) and a low dielectric dissipation factor (Df). The dielectric constant and the dielectric dissipation factor of the high frequency substrate are generally called dielectric properties in the present disclosure.

In a conventional technology, silicon dioxide, aluminum hydroxide, and/or boron nitride can be added into a resin material as fillers, in order to provide a resin substrate that has the anticipated dielectric properties. The addition of silicon dioxide, aluminum hydroxide, and/or boron nitride can adjust the dielectric properties of the resin substrate and can further facilitate to decrease a coefficient of thermal expansion (CTE) of the resin substrate. However, the addition of the fillers cannot enhance a thermal conductivity of a circuit board substrate. Accordingly, additional boron nitride is added into the resin material so as to enhance the thermal conductivity of the circuit board substrate. Boron nitride has a higher thermal conductivity than silicon dioxide or aluminum hydroxide. Therefore, the addition of boron nitride can enhance the thermal conductivity of the resin substrate.

Commercially available boron nitride is mostly shaped as flakes. When a reinforcing material is immersed in the resin material, the flaky boron nitride is attached onto the reinforcing material at random angles. However, after heat compression, almost all of the flaky boron nitride lies flat. In other words, the flaky boron nitride is almost parallel to a surface of the circuit board substrate (X-Y plane), instead of standing upright along a thickness direction (Z direction) of the circuit board substrate. When the flaky boron nitride lies flat on the circuit board substrate, the thermal conductivity of the circuit board substrate in the thickness direction cannot be enhanced effectively and the promotion of the thermal conductivity is restricted.

The thermal conductivity of the commercially available circuit board substrate generally ranges from 0.2 W/mK to 0.6 W/mK. To enable the circuit board substrate to have a thermal conductivity higher than 1 W/mK, 30 phr to 50 phr of boron nitride has to be added in the resin material based on a total weight of the resin material being 100 phr. However, a great amount of boron nitride (30 phr to 50 phr) decreases a fluidity of the resin material and an adhesive force between the resin substrate and the metal layer (i.e., copper layer).

SUMMARY OF THE DISCLOSURE

In response to the above-referenced technical inadequacy, the present disclosure provides a prepreg and a metallic clad laminate.

In one aspect, the present disclosure provides a prepreg. The prepreg includes a reinforcing material and a thermosetting resin layer. The thermosetting resin layer is formed by immersing the reinforcing material in a thermosetting resin composition. The thermosetting resin composition includes a polyphenylene ether resin, a liquid polybutadiene resin, a crosslinker, and fillers. Based on a total weight of the thermosetting resin composition being 100 phr, an amount of the fillers ranges from 50 phr (parts per hundreds of resin) to 70 phr. The fillers include a granular dielectric filler and a flaky thermal conductive filler.

In certain embodiments, based on the total weight of the thermosetting resin composition being 100 phr, an amount of the granular dielectric filler ranges from 30 phr to 50 phr and an amount of the flaky thermal conductive filler ranges from 5 phr to 25 phr.

In certain embodiments, the granular dielectric filler includes a supportive dielectric filler and a filling dielectric filler. A particle size of the supportive dielectric filler ranges from 30 μm to 50 μm, and a particle size of the filling dielectric filler ranges from 5 μm to 20 μm.

In certain embodiments, the granular dielectric filler includes a supportive dielectric filler and a filling dielectric filler. The supportive dielectric filler is a mixture of aluminum oxide and silicon dioxide, and the filling dielectric filler is a mixture of aluminum oxide and silicon dioxide.

In certain embodiments, based on a total weight of the granular dielectric filler, the granular dielectric filler contains 30 wt % to 70 wt % of aluminum oxide and 30 wt % to 70 wt % of silicon dioxide.

In certain embodiments, the flaky thermal conductive filler is boron nitride. An external diameter of the flaky thermal conductive filler ranges from 5 μm to 60 μm.

In certain embodiments, a purity of the granular dielectric filler is higher than 99.2%, and a purity of the flaky thermal conductive filler is higher than 99.0%.

In certain embodiments, the granular dielectric filler is distributed around a periphery of the flaky thermal conductive filler to enable the flaky thermal conductive filler to be in an upright state.

In another aspect, the present disclosure provides a metallic clad laminate. The metallic clad laminate includes a resin substrate and a metal layer. The resin substrate includes a reinforcing material and a thermosetting resin layer.

The thermosetting resin layer is formed by immersing the reinforcing material in a thermosetting resin composition. The thermosetting resin composition includes a polyphenylene ether resin, a liquid polybutadiene resin, a crosslinker, and fillers. Based on a total weight of the thermosetting resin composition being 100 phr, an amount of the fillers ranges from 50 phr to 70 phr. The fillers include a granular dielectric filler and a flaky thermal conductive filler. The metal layer is disposed on the resin substrate, and a thermal conductivity of the metallic clad laminate ranges from 1.0 W/mK to 2.0 W/mK.

In certain embodiments, a dielectric loss (10 GHz) of the metallic clad laminate is lower than or equal to 0.002.

Therefore, by virtue of "based on a total weight of the thermosetting resin being 100 phr, an amount of the fillers ranging from 50 phr to 70 phr" and "the fillers including a granular dielectric filler and a flaky thermal conductive filler", the thermal conductivity of the metallic clad laminate can be enhanced and the issue of a weak bonding force between the metal layer and the resin substrate caused by an excessive amount of the flaky thermal conductive filler can be solved.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

In order to solve the inadequacy of poor thermal conductivity of the conventional circuit board substrate, a granular dielectric filler and a flaky thermal conductive filler are added in a material to prepare a metallic clad laminate. Due to the granular dielectric filler, the flaky thermal conductive filler of the present disclosure can be maintained in an upright state. Even after a heat compression, the flaky thermal conductive filler can still roughly maintain in the upright state along a thickness direction of the thermosetting resin layer, rather than lying flat on the thermosetting resin layer. Therefore, a thermal conductivity of the metallic clad laminate in the thickness direction can be enhanced. In other words, by using both the granular dielectric filler and the flaky thermal conductive filler, the thermal conductivity of the metallic clad laminate can be enhanced to achieve an anticipated value (1 W/mK to 1.5 W/mK) or even higher with only a small amount of the flaky thermal conductive filler (5 phr to 20 phr). Therefore, a fluidity of a resin material and an adhesive force between a resin substrate and a metal layer will not be negatively influenced by adding an excessive amount of the flaky thermal conductive filler.

Figure 1:
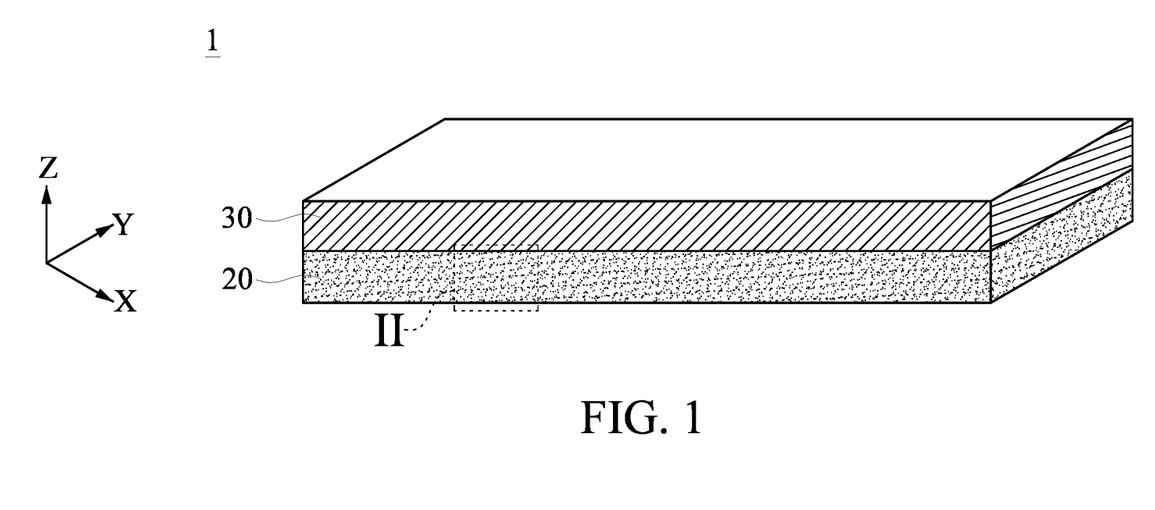
FIG. 1 is a schematic perspective view of a metallic clad laminate according to an embodiment of the present disclosure.
Figure 2:
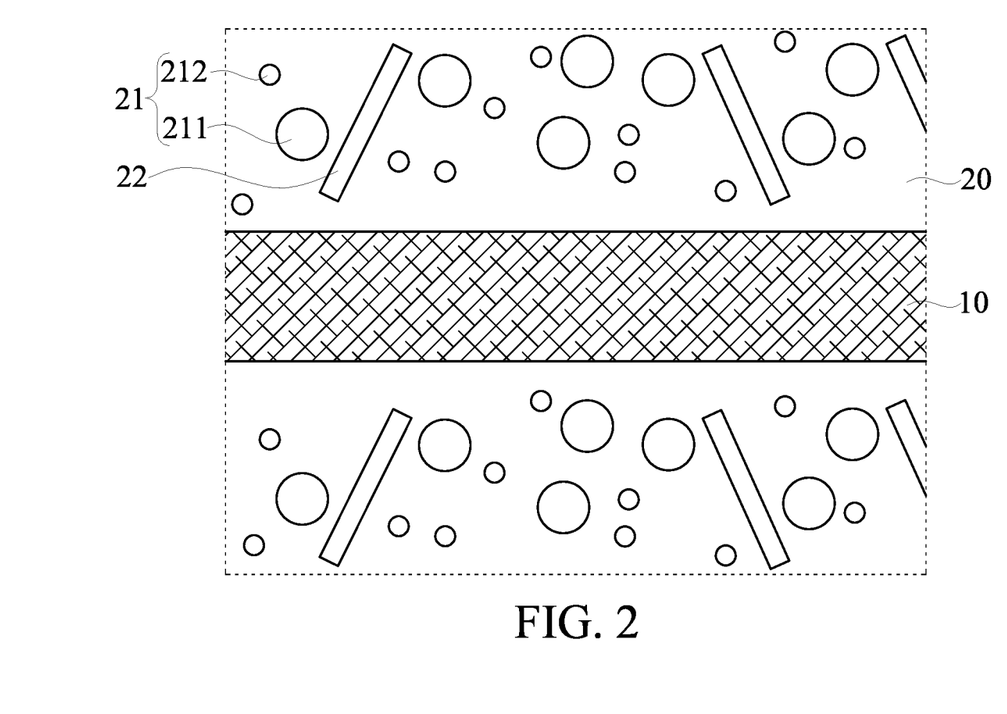
FIG. 2 is an enlarged view of part II of FIG. 1.

Referring to FIG. 1 and FIG. 2, FIG. 1 is a schematic perspective view of the metallic clad laminate according to an embodiment of the present disclosure. FIG. 2 is an enlarged view of part II of FIG. 1. The present disclosure provides a metallic clad laminate 1. The metallic clad laminate 1 includes a reinforcing material 10, a thermosetting resin layer 20, and a metal layer 30. The metallic clad laminate 1 of the present disclosure has excellent dielectric properties and thermal conductive properties; thereby being suitable for preparing a high frequency substrate. In addition, the fluidity of the resin material and the adhesive force between the resin substrate (the reinforcing material 10 and the thermosetting resin layer 20 formed on the reinforcing material 10) and the metal layer 30 can be upheld with the enhancement of the thermal conductivity.

The reinforcing material 10 can be a continuous material. The reinforcing material 10 can be a fiber cloth or an insulating paper, but it is not limited thereto. The reinforcing material 10 can be formed from glass fibers, carbon fibers, graphite fibers, aluminum oxide fibers, silicon carbide fibers, silicon nitride fibers, boron fibers, or any combination thereof. Preferably, the reinforcing material 10 can be formed from glass fibers, but it is not limited thereto. A thickness of the reinforcing material 10 ranges from 30 μm to 200 μm.

The thermosetting resin layer 20 is disposed on the reinforcing material 10. The thermosetting resin layer 20 is formed by immersing the reinforcing material 10 in a thermosetting resin composition, and then drying the thermosetting resin composition attached onto the reinforcing material 10.

In an embodiment, the thermosetting resin layer 20 can be disposed on two opposite surfaces of the reinforcing material 10, or the reinforcing material 10 can be completely covered by the thermosetting resin layer 20. A thickness of the thermosetting resin layer 20 ranges from 20 μm to 200 μm.

The thermosetting resin composition includes a polyphenylene ether resin, a liquid polybutadiene resin, a crosslinker, fillers, and a solvent. In the present disclosure, based on a total weight of the thermosetting resin composition being 100 phr, an amount of the polyphenylene ether resin ranges from 20 phr to 40 phr, an amount of the liquid polybutadiene resin ranges from 40 phr to 70 phr, an amount of the crosslinker ranges from 20 phr to 40 phr, an amount of the fillers ranges from 50 phr to 70 phr, and an amount of the solvent ranges from 30 phr to 50 phr.

Specifically, the polyphenylene ether resin can include only one type of polyphenylene ether resin or multiple types of polyphenylene ether resins. Moreover, the one or multiple types of polyphenylene ether resins can be optionally modified, that is, the polyphenylene ether resin can have a modified group.

In the present disclosure, a weight-average molecular weight (Mw) of the polyphenylene ether resin ranges from 1000 g/mol to 20000 g/mol. Preferably, the weight-average molecular weight of the polyphenylene ether resin ranges from 2000 g/mol to 10000 g/mol. More preferably, the weight-average molecular weight of the polyphenylene ether resin ranges from 2000 g/mol to 2200 g/mol. When the weight-average molecular weight of the polyphenylene ether resin is lower than 20000 g/mol, the polyphenylene ether resin has a high solubility to the solvent which facilitates the preparation of the metallic clad laminate 1 of the present disclosure.

The liquid polybutadiene (LPB) resin is a polybutadiene rubber with low weight-average molecular weight. A weight-average molecular weight of the liquid polybutadiene resin ranges from 1000 g/mol to 10000 g/mol. A viscosity of the liquid polybutadiene resin ranges from 2500 mPa·s to 15000 mPa·s.

The crosslinker can be triallyl isocyanurate (TRIC), triallyl cyanurate (TAC), or trimethallyl isocyanurate (TMAIC), but it is not limited thereto.

The solvent can be toluene, acetone, or butanone, but it is not limited thereto.

The fillers include a granular dielectric filler 21 and a flaky thermal conductive filler 22. The granular dielectric filler 21 can be used to adjust dielectric properties of the metallic clad laminate 1 of the present disclosure.

The flaky thermal conductive filler 22 can be used to enhance the thermal conductivity of the metallic clad laminate 1 of the present disclosure. In addition, the granular dielectric filler 21 surrounds the flaky thermal conductive filler 22, so that the flaky thermal conductive filler 22 can slightly tilt or stand in an upright state and extend along a thickness direction of the thermosetting resin layer 20. Accordingly, the thermal conductivity of the metallic clad laminate 1 in the thickness direction can be enhanced.

In the present disclosure, the term "granular dielectric filler" means that the dielectric filler is spherical or irregular and has similar sizes in different directions. The term "flaky thermal conductive filler" means that the thermal conductive filler is usually formed in a shape of a flake and has a thin thickness in a certain direction.

The granular dielectric filler 21 of the present disclosure further includes a supportive dielectric filler 211 and a filling dielectric filler 212 in order to effectively maintain the flaky thermal conductive filler 22 to stand in the upright state. The supportive dielectric filler 211 has a larger particle size than the filling dielectric filler 212.

Accordingly, in addition to the granular dielectric filler 21 adjusting the dielectric properties of the metallic clad laminate 1, the granular dielectric filler 21 can further effectively maintain the flaky thermal conductive filler 22 to be slightly tilted or to stand in the upright state. Since the filling dielectric filler 212 has a small particle size, the filling dielectric filler 212 can fill between the supportive dielectric filler 211 and/or the flaky thermal conductive filler 22, so that the granular dielectric filler 21 and the flaky thermal conductive filler 22 can pile up compactly. Therefore, the dielectric properties of the metallic clad laminate 1 in the present disclosure are uniform. Moreover, the filling dielectric filler 212 can not only support the supportive dielectric filler 211 and the flaky thermal conductive filler 22, but also provide more thermal-conductive paths to enhance the thermal conductivity of the metallic clad laminate 1. Specifically, the thermal conductivity of the metallic clad laminate 1 of the present disclosure can reach up to a range from 1 W/mK to 1.5 W/mK, which is apparently higher than the thermal conductivity of the commercially available printed circuit board ranging from 0.3 W/mK to 0.6 W/mK.

It is worth mentioning that if only the supportive dielectric filler 211 is used (i.e., without adding the filling dielectric filler 212), the fillers may pile up loosely and cannot effectively maintain the flaky thermal conductive filler 22 to be slightly tilted or to stand in an upright state; hence, a flatness and the thermal conductivity of the metallic clad laminate 1 in the present disclosure can be negatively influenced.

In a preferable embodiment, a particle size of the supportive dielectric filler 211 ranges from 30 μm to 50 μm. A particle size of the filling dielectric filler 212 ranges from 5 μm to 20 μm, and a particle size of the flaky thermal conductive filler 22 ranges from 20 μm to 60 μm. Accordingly, the granular dielectric filler 21 (the supportive dielectric filler 211 and the filling dielectric filler 212) and the flaky thermal conductive filler 22 can be piled up compactly, and the flaky thermal conductive filler 22 can be slightly tilted or stand in an upright state. Even after implementing a heat compression, the metallic clad laminate 1 can still have a good thermal conductivity.

In the present embodiment, based on the total weight of the thermosetting resin composition being 100 phr, the thermosetting resin composition contains 30 phr to 50 phr of the granular dielectric filler 21 and 5 phr to 25 phr of the flaky thermal conductive filler 22. In other words, a weight ratio of the granular dielectric filler 21 to the flaky thermal conductive filler 22 ranges from 1.2 to 10. More specifically, based on the total weight of the thermosetting resin composition being 100 phr, the thermosetting resin composition contains 20 phr to 40 phr of the supportive dielectric filler 211 and 10 phr to 25 phr of the filling dielectric filler 212.

In the present disclosure, the flaky thermal conductive filler 22 can be boron nitride. In the present disclosure, the granular dielectric filler 21 contains both silicon dioxide and aluminum oxide, and an amount of aluminum oxide is usually higher than an amount of silicon dioxide.

In an embodiment of the present disclosure, the granular dielectric filler 21 contains 30 wt % to 70 wt % of aluminum oxide and 30 wt % to 70 wt % of silicon dioxide. Preferably, the granular dielectric filler 21 contains from 30 wt % to under 50 wt % of aluminum oxide, and from over 50 wt % to 70 wt % of silicon dioxide. Silicon dioxide can be molten or crystalline silicon dioxide. Considering the dielectric properties of the overall metallic clad laminate 1, the silicon dioxide is preferably molten silicon dioxide.

Generally, the amounts of silicon dioxide and aluminum oxide can be adjusted according to the anticipating dielectric constant. In an embodiment, the dielectric constant of the metallic clad laminate 1 ranges from 3 to 8. Preferably, the dielectric constant of the metallic clad laminate 1 ranges from 3.5 to 6, but the present disclosure is not limited thereto. Specifically, when the anticipating dielectric constant is relatively high, the amount of aluminum oxide can be increased, and when the anticipating dielectric constant is relatively low, the amount of silicon dioxide can be decreased and silicon dioxide can be added to supply the required total amount.

Specifically, the supportive dielectric filler 211 can be silicon dioxide, aluminum oxide, or a mixture of silicon dioxide and aluminum oxide. The filling dielectric filler 212 can be silicon dioxide, aluminum oxide, or a mixture of silicon dioxide and aluminum oxide. In a preferable embodiment, the supportive dielectric filler 211 is a mixture of silicon dioxide and aluminum oxide, and a weight ratio of aluminum oxide to silicon dioxide ranges from 5:5 to 8:2. The filling dielectric filler 212 is a mixture of silicon dioxide and aluminum oxide, and a weight ratio of aluminum oxide to silicon dioxide ranges from 2:8 to 5:5.

Moreover, in addition to dielectric constant and thermal conductivity, the dielectric loss of the metallic clad laminate 1 is also an important property to evaluate. The granular dielectric filler whose purity is higher than 99.2% and the flaky thermal conductive filler whose purity is higher than 99.0% are used in the present disclosure, so as to reduce the dielectric loss of the metallic clad laminate 1.

The term "purity higher than 99.2%" means that impurities in the granular dielectric filler, except for silicon dioxide and aluminum oxide, are lower than 0.8%. The term "purity higher than 99.0%" means that impurities in the flaky thermal conductive filler, except for silicon dioxide and aluminum oxide, are lower than 1.0%. In the present disclosure, the impurities can be compounds containing sodium, calcium, iron, or magnesium. However, the present disclosure is not limited thereto.

Figure 3:
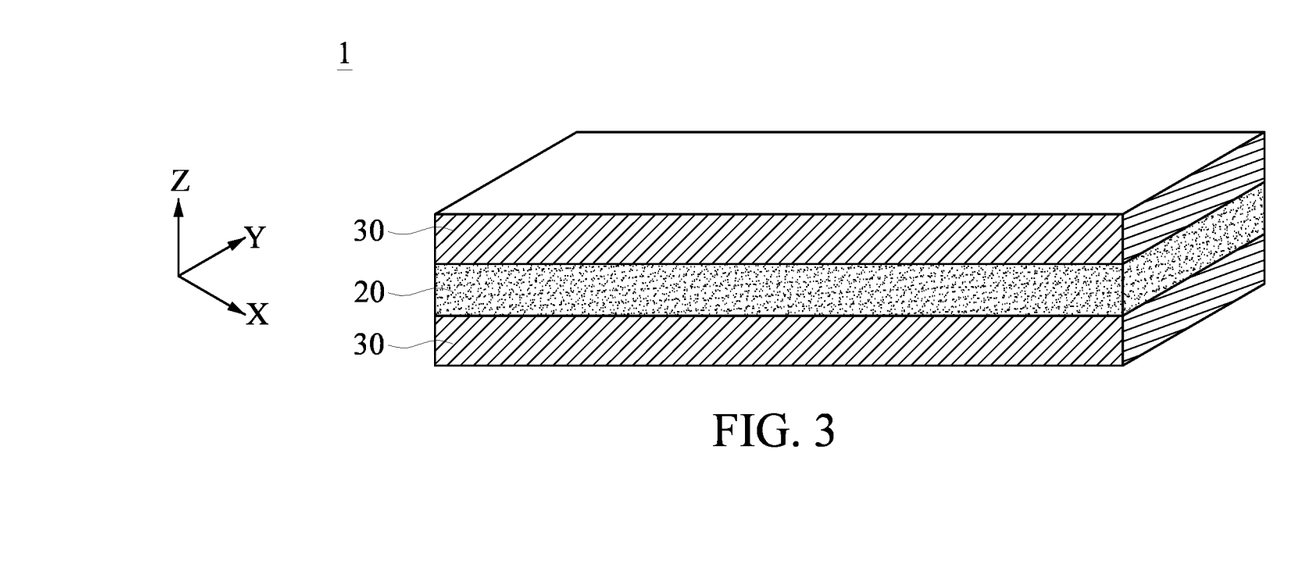
FIG. 3 is a schematic perspective view of the metallic clad laminate according to another embodiment of the present disclosure.

The metal layer 30 is disposed on the thermosetting resin layer 20. A quantity of the metal layer 30 can be decided according to different types of the metallic clad laminate 1. For example, the metal layer 30 can be disposed on either one surface of the thermosetting resin layer 20 so as to prepare a single-sided metallic clad laminate as shown in FIG. 1. The metal layer 30 can also be disposed on both surfaces of the thermosetting resin layer 20 so as to prepare a double-sided metallic clad laminate as shown in FIG. 3.

The method for manufacturing the metallic clad laminate 1 of the present disclosure includes steps as follows. The reinforcing material 10 mentioned previously is provided. In the present disclosure, the reinforcing material 10 is made of glass fibers. The reinforcing material 10 can be processed through some pretreatments, such as surface modification.

Subsequently, a thermosetting resin composition is prepared. The thermosetting resin composition includes the aforesaid polyphenylene ether resin, the aforesaid liquid polybutadiene resin, the aforesaid crosslinker, the aforesaid fillers, and the aforesaid solvent. The fillers (the granular dielectric filler 21 and the flaky thermal conductive filler 22) are uniformly dispersed in the thermosetting resin composition.

Specifically, based on the total weight of the thermosetting resin composition being 100 phr, the thermosetting resin composition contains 20 phr to 40 phr of the supportive dielectric filler 211, 10 phr to 25 phr of the filling dielectric filler 212, and 5 phr to 25 phr of the flaky thermal conductive filler 22.

The aforesaid pretreated reinforcing material 10 is immersed in the thermosetting resin composition which disperses the fillers (the granular dielectric filler 21 and the flaky thermal conductive filler 22). After immersion, the reinforcing material 10 submerged in the thermosetting resin composition is dried to remove the solvent, so that the thermosetting resin layer 20 is formed on a surface of the reinforcing material 10, and a semi-solidified prepreg (including the reinforcing material 10 and the thermosetting resin layer 20) can be obtained. The prepreg can be cut according to practical requirements.

The aforesaid prepreg and a metal layer 30 are implemented to perform a heat compression, so as to dispose the metal layer 30 onto the prepreg. After being baked, a resin substrate is formed from the prepreg, and the metallic clad laminate 1 of the present disclosure is obtained. The metallic clad laminate 1 includes the resin substrate and the metal layer 30 disposed on the resin substrate.

To prove that the dielectric properties can be adjusted and the thermal conductivity can be enhanced by adding both the granular dielectric filler 21 and the flaky thermal conductive filler 22, different metallic clad laminates 1 of the present disclosure are prepared. The metallic clad laminates 1 include different thermosetting resin layers 20 which contain fillers with different particle sizes or different components and ratios. The specific parameters for preparing the metallic clad laminate 1 are listed in Table 1. In addition, properties of the metallic clad laminate 1 are evaluated and listed in Table 1. The methods to evaluate the metallic clad laminate 1 are illustrated as follows.

(1) Thermal conductivity analysis test: the thermal conductivity of the metallic clad laminate 1 is measured by a thermal resistance and conductivity measurement apparatus (Longwin, LW-9389) according to the ASTM-D5470 testing standard.

(2) Dielectric constant (10 GHz): the dielectric constant of the metallic clad laminate 1 is measured by a dielectric analyzer (HP Agilent E5071C) at a frequency of 10 GHz.

(3) Dielectric loss (10 GHz): the dielectric loss of the metallic clad laminate 1 is measured by a dielectric analyzer (HP Agilent E5071C) at a frequency of 10 GHz.

(4) Peeling strength test: the peeling strength of the metallic clad laminate 1 is measured according to the IPC-TM-650-2.4.8 testing standard.

TABLE 1 preparation conditions and characteristic evaluations of the metallic clad laminates of Examples 1 to 4 and Comparative Examples 1 to 4 (the amount of the fillers being based on the total weight of the thermosetting resin composition being 100 phr). The supportive dielectric filler is a mixture of aluminum oxide and silicon dioxide, the filling dielectric filler is a mixture of aluminum oxide and silicon dioxide, and the flaky thermal conductive filler is boron nitride. A weight ratio of aluminum oxide to silicon dioxide is represented by $Al_2O_3:SiO_2$.

| | | Example | | | | Comparative Example | | | |
|---|---|---|---|---|---|---|---|---|---|
| | | 1 | 2 | 3 | 4 | 1 | 2 | 3 | 4 |
| Supportive dielectric filler | Amount (phr) | 30 | 30 | 30 | 30 | 0 | 0 | 30 | 30 |
| | $Al_2O_3:SiO_2$ | 7:3 | 6:4 | 7:3 | 7:3 | — | — | 7:3 | 6:4 |
| | Particle size (μm) | 30 | 40 | 40 | 40 | — | — | 30 | 40 |
| | Purity (%) | 99.4 | 99.3 | 99.2 | 99.7 | — | — | 98.5 | 99.3 |
| Filling dielectric filler | Amount (phr) | 20 | 20 | 20 | 20 | 50 | 0 | 20 | 20 |
| | $Al_2O_3:SiO_2$ | 3:7 | 3:7 | 3:7 | 3:7 | 3:7 | — | 3:7 | 3:7 |
| | Particle size (μm) | 5 | 7 | 8 | 12 | 8 | — | 6 | 7 |
| | Purity (%) | 99.3 | 99.6 | 99.7 | 99.8 | 99.7 | — | 98.5 | 99.6 |
| Flaky thermal conductive filler | Amount (phr) | 15 | 15 | 15 | 20 | 20 | 70 | 15 | 15 |
| | Particle size (μm) | 10 | 20 | 25 | 25 | 25 | 10 | 10 | 18 |
| | Purity (%) | 99.6 | 99.6 | 99.6 | 99.6 | 99.6 | 99.6 | 99.6 | 97.9 |
| Property evaluation | | | | | | | | | |
| Thermal conductivity (W/mK) | | 1.09 | 1.31 | 1.39 | 1.50 | 0.91 | 1.5 | 1.11 | 1.25 |
| Dielectric constant (10 GHz) | | 3.8 | 3.9 | 3.9 | 4.0 | 4.5 | 4.7 | 4.1 | 4.6 |
| Dielectric loss × $10^3$ (10 GHz) | | 1.8 | 1.6 | 1.6 | 1.5 | 1.3 | 1.4 | 3.6 | 3.8 |
| Peeling strength (lb/in) | | 6.1 | 5.8 | 5.6 | 5.5 | 1.5 | 0.8 | 5.6 | 3.9 |

According to results of Table 1, the flaky thermal conductive filler 22 can be tilted or stand in an upright state along the thickness direction of the thermal setting resin layer 20 by using both the granular dielectric filler 21 and flaky thermal conductive filler 22, and controlling the particles sizes of the supportive dielectric filler 211 and the filling dielectric filler 212. Hence, the thermal conductivity of the metallic clad laminate 1 is increased to a range from 1.0 W/mK to 2.0 W/mK. More specifically, the thermal conductivity of the metallic clad laminate 1 ranges from 1.0 W/mK to 1.8 W/mK. Therefore, compared to the circuit board substrate in the conventional technology, the metallic clad laminate 1 of the present disclosure can have a high thermal conductivity without adding an excessive amount of boron nitride.

According to results of Table 1, the thermal conductivity (1.0 W/mK to 2.0 W/mK) and the peeling strength (5.0 lb/in to 8.0 lb/in) of the metallic clad laminate 1 can be enhanced by adjusting the weight ratio of the granular dielectric filler 21 to the flaky thermal conductive filler 22. In addition, the metallic clad laminate 1 has good dielectric properties (Dk ranging from 3 to 8 and Df being lower than 0.002) so that the metallic clad laminate 1 can be applied in high frequency transmission.

Beneficial Effects of the Embodiments

In conclusion, the prepreg and the metallic clad laminate 1 provided in the present disclosure, by virtue of "based on a total weight of the thermosetting resin being 100 phr, an amount of the fillers ranging from 50 phr to 70 phr" and "the fillers including a granular dielectric filler 21 and a flaky thermal conductive filler 22", the thermal conductivity of the metallic clad laminate 1 is enhanced and the issue of a weak bonding force between the metal layer 30 and the resin substrate 20 caused by an excessive amount of the flaky thermal conductive filler 22 is solved.

Further, the prepreg and the metallic clad laminate 1 provided in the present disclosure, by virtue of "based on the total weight of the thermosetting resin being 100 phr, the thermosetting resin containing 30 phr to 50 phr of the granular dielectric filler 21 and 5 phr to 25 phr of the flaky thermal conductive filler 22" or "a particle size of the supportive dielectric filler 211 ranges from 30 μm to 50 μm, and a particle size of the filling dielectric filler 212 ranges from 5 μm to 20 μm", the flaky thermal conductive filler 22 is enabled to be tilted or stand in an upright state along the thickness direction of the thermosetting resin layer 20; thereby enhancing the thermal conductivity in the thickness direction of the metallic clad laminate 1.

Further, the prepreg and the metallic clad laminate 1 provided in the present disclosure, by virtue of "the supportive dielectric filler 211 being a mixture of aluminum oxide and silicon dioxide, and the filling dielectric filler 212 being a mixture of aluminum oxide and silicon dioxide" or "the granular dielectric filler 21 including 30 wt % to 70 wt % of aluminum oxide and 30 wt % to 70 wt % of silicon dioxide", the dielectric constant of the metallic clad laminate 1 is controlled to conform to the anticipated value.

Further, the prepreg and the metallic clad laminate 1 provided in the present disclosure, by virtue of "a purity of the granular dielectric filler being higher than 99.2%, and a purity of the flaky thermal conductive filler being higher than 99.0%", the metallic clad laminate 1 can have advantages of low dielectric loss and high thermal conductivity.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A prepreg, comprising:
a reinforcing material; and
a thermosetting resin layer formed by immersing the reinforcing material in a thermosetting resin composition; wherein the thermosetting resin composition includes a polyphenylene ether resin, a liquid polybutadiene resin, a crosslinker, and fillers, based on a total weight of the thermosetting resin composition being 100 phr, an amount of the fillers ranges from 50 phr to 70 phr, the fillers include a granular dielectric filler and a flaky thermal conductive filler, and the flaky thermal conductive filler is boron nitride;
wherein a weight-average molecular weight of the liquid polybutadiene resin ranges from 1000 g/mol to 10000 g/mol, and an external diameter of the flaky thermal conductive filler ranges from 5 μm to 60 μm;
wherein the granular dielectric filler includes a supportive dielectric filler and a filling dielectric filler, a particle size of the supportive dielectric filler ranges from 30 μm to 50 μm, and a particle size of the filling dielectric filler ranges from 5 μm to 20 μm;
wherein the supportive dielectric filler is a mixture of aluminum oxide and silicon dioxide, wherein, in the supportive dielectric filler, a weight proportion of aluminum oxide to silicone dioxide ranges 5:5 to less than 8:2;
wherein the filling dielectric filler is a mixture of aluminum oxide and silicon dioxide, wherein, in the filling dielectric filler, a weight proportion of aluminum oxide to silicone dioxide ranges 2:8 to less than 5:5.

2. The prepreg according to claim 1, wherein, based on the total weight of the thermosetting resin composition being 100 phr, an amount of the granular dielectric filler ranges from 30 phr to 50 phr, and an amount of the flaky thermal conductive filler ranges from 5 phr to 25 phr.

3. The prepreg according to claim 1, wherein, based on a total weight of the granular dielectric filler, the granular dielectric filler contains 30 wt % to 70 wt % of aluminum oxide and 30 wt % to 70 wt % of silicon dioxide.

4. The prepreg according to claim 1, wherein an external diameter of the flaky thermal conductive filler ranges from 25 pin to 60 pin.

5. The prepreg according to claim 1, wherein a purity of the granular dielectric filler is higher than 99.2%, and a purity of the flaky thermal conductive filler is higher than 99.0%.

6. The prepreg according to claim 1, wherein the granular dielectric filler is distributed around a periphery of the flaky thermal conductive filler to enable the flaky thermal conductive filler to be in an upright state.

7. A metallic clad laminate, comprising:
a resin substrate including a reinforcing material and a thermosetting resin layer, the thermosetting resin layer being formed by immersing the reinforcing material in a thermosetting resin composition; wherein the thermosetting resin composition includes a polyphenylene ether resin, a liquid polybutadiene resin, a crosslinker, and fillers, based on a total weight of the thermosetting resin composition being 100 phr, an amount of the fillers ranges from 50 phr to 70 phr, the fillers include a granular dielectric filler and a flaky thermal conductive filler, and the flaky thermal conductive filler is boron nitride; and
a metal layer disposed on the resin substrate;
wherein a thermal conductivity of the metallic clad laminate ranges from 1.0 W/mK to 2.0 W/mK;
wherein a weight-average molecular weight of the liquid polybutadiene resin ranges from 1000 g/mol to 10000 g/mol, and an external diameter of the flaky thermal conductive filler ranges from 5 μm to 60 μm;
wherein the granular dielectric filler includes a supportive dielectric filler and a filling dielectric filler, a particle size of the supportive dielectric filler ranges from 30 μm to 50 μm, and a particle size of the filling dielectric filler ranges from 5 μm to 20 μm;
wherein the supportive dielectric filler is a mixture of aluminum oxide and silicon dioxide, wherein, in the supportive dielectric filler, a weight proportion of aluminum oxide to silicone dioxide ranges 5:5 to less than 8:2;
wherein the filling dielectric filler is a mixture of aluminum oxide and silicon dioxide, wherein, in the filling dielectric filler, a weight proportion of aluminum oxide to silicone dioxide ranges 2:8 to less than 5:5.

8. The metallic clad laminate according to claim 7, wherein a dielectric loss of the metallic clad laminate is lower than or equal to 0.002.

9. The prepreg according to claim 1, wherein, based on a total weight of the thermosetting resin composition being 100 phr, an amount of the polyphenylene ether resin ranges from 20 phr to 40 phr, an amount of the liquid polybutadiene resin ranges from 40 phr to 70 phr, an amount of the crosslinker ranges from 20 phr to 40 phr, and an amount of the fillers ranges from 50 phr to 70 phr.

10. The prepreg according to claim 1, wherein a thickness of the thermosetting resin layer ranges from 20 μm to 200 μm.

11. The prepreg according to claim 1, wherein a weight ratio of the granular dielectric filler to the flaky thermal conductive filler ranges from 1.2 to 10.

12. The metallic clad laminate according to claim 7, wherein the peeling strength of the metallic clad laminate ranges from 5.0 lb/in to 8.0 lb/in.

* * * * *